(12) United States Patent
Card et al.

(10) Patent No.: US 7,169,313 B2
(45) Date of Patent: Jan. 30, 2007

(54) PLATING METHOD FOR CIRCUITIZED SUBSTRATES

(75) Inventors: Norman A. Card, Lockwood, NY (US); Robert D. Edwards, Binghamton, NY (US); John J. Konrad, Endicott, NY (US); Roy H. Magnuson, Endicott, NY (US); Timothy L. Wells, Apalachin, NY (US); Michael Wozniak, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/128,272

(22) Filed: May 13, 2005

(65) Prior Publication Data

US 2006/0255009 A1 Nov. 16, 2006

(51) Int. Cl.
*H01B 13/00* (2006.01)
*H01K 3/10* (2006.01)

(52) U.S. Cl. .............................. 216/13; 29/852; 29/847
(58) Field of Classification Search ................. 216/13
See application file for complete search history.

(56) References Cited

U.S. PATENT DOCUMENTS

| | | | |
|---|---|---|---|
| 4,532,152 A * | 7/1985 | Elarde ......................... 216/13 |
| 4,702,792 A | 10/1987 | Chow et al. | |
| 4,775,611 A | 10/1988 | Sullivan | |
| 5,063,951 A | 11/1991 | Bard et al. | |
| 5,084,071 A | 1/1992 | Nenadic et al. | |
| 5,118,385 A | 6/1992 | Kumar et al. | |
| 5,160,579 A * | 11/1992 | Larson ......................... 216/18 |
| 5,289,639 A | 3/1994 | Bard et al. | |
| 5,308,796 A | 5/1994 | Feldman et al. | |
| 5,338,645 A | 8/1994 | Henderson et al. | |
| 5,358,622 A | 10/1994 | Korsten | |
| 5,378,307 A | 1/1995 | Bard et al. | |
| 5,468,409 A | 11/1995 | Dull | |
| 5,494,781 A | 2/1996 | Ohtani et al. | |
| 5,502,893 A | 4/1996 | Endoh et al. | |
| 5,512,335 A | 4/1996 | Miller et al. | |
| 5,557,844 A * | 9/1996 | Bhatt et al. .................... 29/852 |
| 5,792,672 A * | 8/1998 | Chan et al. ................. 438/622 |
| 6,162,365 A * | 12/2000 | Bhatt et al. .................... 216/13 |
| 6,547,974 B1 | 4/2003 | Albrechta et al. | |
| 2003/0011458 A1* | 1/2003 | Nuytkens et al. ........... 336/200 |
| 2003/0071013 A1* | 4/2003 | Tsao et al. .................... 216/13 |
| 2003/0162047 A1* | 8/2003 | Appelt et al. ............... 428/570 |

* cited by examiner

*Primary Examiner*—Nadine Norton
*Assistant Examiner*—Mahmoud Dahimene
(74) *Attorney, Agent, or Firm*—Hinman, Howard & Kattell, LLP; Lawrence R. Fraley

(57) ABSTRACT

A method of plating a circuit pattern on a substrate to produce a circuitized substrate (e.g., a printed circuit board) in which a dual step metallurgy application process is used in combination with a dual step photo-resist removal process. Thru-holes are also possible, albeit not required.

15 Claims, 6 Drawing Sheets

PLATING METHOD FOR CIRCUITIZED SUBSTRATES

TECHNICAL FIELD

The invention relates to the manufacture of circuitized substrates such as printed circuit boards, chip carriers and the like, and particularly to such manufacture wherein pattern plating is used to form the circuit lines for the substrate.

BACKGROUND OF THE INVENTION

Circuitized substrates, and particularly printed circuit boards (PCBs), present a substantially planar surface on which electronic components are to be mounted. Circuit paths for these components are provided by forming conductive lines on the surface that connect component-mounting "thru-holes" in the board, for those components to which such connections are required, as well as simply between pads or the like if only surface coupling is desired, e.g., where solder balls are used as in the case of ball grid array (BGA) package structures. Electrical leads that extend from the components are electrically connected to the conductive lines when the components are mounted to the board thru-holes, or just to the pads if pad-to-pad and/or solder ball connections are used. PCBs can be single-sided, in which case components are mounted on only one surface of the circuit board, or double-sided, in which case components are mounted on opposing surfaces (and often connected to one another through the board). Today's PCBs typically include several dielectric (e.g., a glass fiber-resin combination material known as "FR4") layers interspersed with the requisite number of conductor (e.g., copper) layers, which may be in the form of signal, power or ground layers. For such internal signal layers, the connecting lines thereof are also typically formed using the same processing as the external surface conductors, with the formed dielectric-conductor sub-composite then aligned and bonded to other sub-composites, typically using conventional lamination processes, to form the final multilayered (composite) structure.

PCBs are generally manufactured using either a subtractive etch process, a pattern plating process, or an electro-less pattern plating process, the latter also referred to as additive pattern plating. In all of these processes, a circuit mask that lays out the desired pattern of the conductive lines is transferred to the circuit board by printing the circuit mask pattern onto a polymeric radiation-sensitive resist material deposited on the board. The resist material is irradiated in the pattern of the circuit mask so that it is physically transformed where it is irradiated and is unchanged where shielded by the circuit mask. The resist material is then "developed" by exposing it to a fast-reacting chemical solution that selectively removes either the irradiated material (called a positive resist) or removes the non-irradiated material (called a negative resist).

Subtractive etching of PCBs typically begins with a board substrate comprised of a non-conductive material on which a layer of conductive material such as copper has been plated. A layer of photo-resist material is then deposited and "developed" in the circuit mask pattern so as to expose the conductive material where circuit paths are not desired. The exposed conductive material in the photo-resist voids is then etched away. Finally, the remaining photo-resist material is removed, leaving behind conductive lines wherever circuit paths were desired. The subtractive etch process provides good control over circuit path height because the amount of conductive material plated onto the substrate can be generally controlled very well. Precisely controlled circuit path height is especially important with surface mount techniques, especially when forming fine line circuitry with highly dense patterns. Unfortunately, the subtractive etch process generally does not provide precise control over circuit path width, due to plating variation and lack of sharply defined path edges. The lack of width control is disadvantageous with current demands for increasingly high component mounting densities that require relatively thin conductive lines placed in close proximity to each other.

Pattern plating, also referred to as acid plate pattern plating, uses electro-plating techniques to deposit conductive lines in circuit paths defined by photo-resist material voids. More specifically, a conductive foil layer on the circuit board is connected to an electrode and the conductive material is deposited onto the board in the resist material voids using an oppositely charged electrode. The width of the conductive lines is generally dependant on the developed photo-resist pattern, which typically is of photographic sharpness. Pattern plating thereby provides good control over circuit path width and permits conductive lines of relatively fine width. The circuit path height, however, is not as easily controlled because such height is dependent on the density of the desired conductive lines. As a result, isolated conductive lines are typically thicker than densely packed (closely spaced) conductive lines. Thus, line height is not precisely controlled by the acid plate process.

The additive (electro-less) plating process is similar to the acid plate pattern process, except that chemical plating processes are used rather than electro-plating processes. Additive plate fabrication generally requires more time to complete as compared to acid plate pattern fabrication but is not as susceptible to circuit path height variation according to line density. Additive plating does occasionally result in copper nodule formation, however.

The surfaces of pattern plated circuit boards need to be planarized prior to successful plating. Planarization methods such as surface machining remove non-planar regions of the board. Chemical mechanical polish, another often used method also employed in the semiconductor and ceramic industries, contains abrasive slurry materials which attack both resist and copper surfaces. Such polishing techniques are not compatible with many organic-based substrates, which are often used in conjunction with surface-mount technology circuit boards. Surface-mount technology is gaining in popularity because it permits higher component densities and faster component mounting as compared with more conventional wire-bonding techniques in which it is necessary to electrically interconnect several small contacts and conductor sites with fine, delicate wires. Such polishing techniques are generally incompatible with organic based substrates because such substrates are somewhat flexible and typically have surface undulations. The surface undulations are due to variations in substrate thickness and also to the inherent flexibility of the boards, which permits bowing and warping. Conventional chemical-mechanical polishing techniques will not follow these undulations and contours of flexible substrates. As a result, board areas of extra thickness or that bow outward will be left with conductive lines having areas that are too thin, and board areas of reduced thickness will be left with conductive lines having areas that are too thick.

In U.S. Pat. No. 6,547,974, issued Apr. 15, 2003, there is described producing a PCB using a process which includes patterning a photo-resist layer according to a circuit mask that defines desired circuit paths. The photo-resist pattern layer is formed by removing the photo-resist from the board in the desired circuit paths and a conductive material is plated onto the board in the voids defined by the circuit mask so that the height of the conductive material relative to the substrate equals or exceeds the height of the photo-resist layer relative to the substrate. A low-reactive solution is applied over the conductive material and removes a surface portion thereof. As the solution removes the conductive layer, it forms a film barrier and the solution composition changes, both of which substantially inhibit any further removal of the conductive material. Next, the film barrier is removed from the board allowing another film barrier to form stimulating the removal of further conductive material. The removal step is repeated until the conductive material is at a desired height relative to the height of the resist layer. The board is then finished using conventional circuit board fabrication techniques.

In U.S. Pat. No. 5,502,893, issued Apr. 2, 1996, there is described a PCB manufacturing method in which an organic non-conductive layer does not separate from the PCB's "metal core" (e.g., of aluminum) even in an environment of high temperature and high humidity since both the metal core and the organic non-conductive layer are firmly adhered. An organic non-conductive layer is formed over the metal core with a metal plated layer (e.g., nickel) therebetween for protecting the metal core. A metal oxide layer is also used for enhancing adhesive force. By utilizing such a metal oxide layer, it is possible to more effectively prevent the organic non-conductive layer from separating from the plated layer (and thus the metal core). Further, the protecting metal plated layer can protect the metal core from erosion caused by contact with a strong alkali solution, etc. as may be used in a process of forming the metal oxide layer. Still further, copper plating inside the through hole can be performed easily.

In U.S. Pat. No. 5,494,781, issued Feb. 27, 1996, there is described a method for manufacturing a PCB in which there is formed on a top surface of an insulating substrate a layer of plating ground layer as a metal film, irradiating using electromagnetic waves such as provided by a laser, a boundary edge zone of what are referred to as "non-circuit parts" with respect to circuit-printing parts on the insulating substrate in correspondence to a pattern of the non-circuit parts to remove the plating ground layer at the part irradiated by the electromagnetic waves, and thereafter to form a plating on the surface of the plating ground layer at the non-irradiated parts. The apparent result is that the laser irradiation is carried out only with respect to the boundary edge zone of the non-circuit parts, without irradiating all of the non-circuit parts.

In U.S. Pat. No. 5,468,409, issued Nov. 21, 1995, there is described an etching solution for precision etching of vapor-deposited copper films of complex curvature on PCBs. Cupric chloride, sodium chloride and de-ionized water are constituents of the etching solution, which the authors claim are able to produce circuit lines of about three to ten mils.

In U.S. Pat. No. 5,358,622, issued Oct. 25, 1994, there is described a procedure for producing PCBs with pads for insertion of surface-mount devices (called SMDs by the authors). A copper lined base plate is provided with a positive photo-protective layer with a coating thickness lesser or equal to the depth of the pads to be built up for the connection of the SMD components. The positive photo-protective layer is exposed using a primary film with a window mask corresponding to the desired pad arrangement, and the exposed base plate is developed in a developing bath such that the photo-protective layer is removed in the area of the exposed windows, exposing open copper areas. The base plate developed in this way is exposed with a secondary film using a mask for the strip conductors, whereby the strip conductors are modeled as opaque areas. The twice-exposed base plate is electroplated in a tin or tin-lead bath, whereby a tin or tin-lead coating is built up in the region of the open copper area until the pads have been formed by this means with a depth greater or equal to the thickness of the photo-protective layer. The electroplated base plate is developed in a developing bath, whereby the tin plated pad areas and the protective layer regions covered by the opaque strip conductor areas of the secondary film remain. The base plate developed in this way is etched, whereby the laid-open copper areas are removed and the protective lacquer existing in the strip conductor areas is removed, laying bare the copper strip conductor areas.

In U.S. Pat. No. 5,338,645, issued Aug. 16, 1994, PCBs with three-dimensional surfaces are disclosed. Using a first technique, a three dimensional surface is formed on a substrate having a high melting point or permitting a high degree of infrared energy transmittance. The surface contains a layer of metallization maintained at a depth of less than two microns. An infrared laser then moves around the surface and selectively vaporizes the metallization, leaving a desired printed circuit pattern. The remaining metallization is plated to a useable depth. Using a second technique, a fiber optic bundle is machined on one end to mate with the three dimensional surface. The three dimensional surface, metallized and coated with photo-resist, resides in intimate contact with this first end. A second end of the cable is flat and resides in intimate contact with two-dimensional master photo artwork. A pattern is exposed on the photo-resist through the fiber optic bundle, and the metallization is etched using conventional techniques.

In U.S. Pat. No. 5,308,796, issued May 3, 1994, there is described a deposition process which involves formation of a silicide, such as palladium silicide, in the region upon which copper deposition is desired. The silicide acts as a catalyst to initiate reduction of copper ions from an electro-less plating bath to produce an acceptably low resistance copper deposition. Thus, for example, in the case of producing an interconnect involving a silicon region at the bottom of the interconnect structure defined through a silicon dioxide region, palladium is first evaporated over the entire surface and is heated to form palladium silicide only at the base of the via structure. The palladium on the silicon dioxide surface is un-reacted. A selective etch is then used to remove the un-reacted surface palladium. Upon substrate immersion in a conventional electro-less copper plating bath, copper deposition proceeds selectively on the palladium silicide surfaces and continues up through the interconnect. The silicon dioxide surface is non-catalytic to the plating step and induces essentially no copper deposition.

In U.S. Pat. No. 5,160,579, issued Nov. 3, 1992, there is described a process in which the areas of a PCB where electrical components are to be solder connected, such as thru-holes, surrounding pads and surface mount areas, are selectively provided with a metal coating (e.g., tin-lead) which preserves and promotes solderability at these locations, by a process in which a photo-imageable electro-phoretically deposited organic resin is used to provide, on an already patterned surface, an additional resist pattern which selectively exposes areas on which the solderable metal coating is to be provided and in which the resist serves also as an etch resist for metal areas over which it is arranged.

In U.S. Pat. No. 5,118,385, issued Jun. 2, 1992, there is described a method for making a multilayered electrical inter-connect on substrates such as PCBs in which the inter-connect includes stacked pillars between layers, the method using a minimal number of conventional process steps. The method includes sputtering a chromium/copper/titanium tri-layer onto a dielectric base, depositing a patterned mask on the tri-layer, etching the exposed tri-layer, removing the mask, depositing a layer of polyimide over the un-etched copper, forming a via in the polyimide above the copper, plating nickel into the via using electro-less plating, and polishing the inter-connect to form a planar top surface.

In U.S. Pat. No. 5,084,071, issued Jan. 28, 1992, there is described a method of chemical mechanical polishing an electronic component substrate including the steps of obtaining an article having at least two features thereon or therein which have a different etch rate with respect to a particular etchant; contacting the article with a polishing pad while contacting the substrate with a slurry containing the etchant wherein the slurry includes abrasive particles (which do not include alumina), a transition metal chelated salt, a solvent for the salt, and a small but effective amount of alumina. The polishing causes the two features to be substantially coplanar.

In U.S. Pat. No. 4,775,611, issued Oct. 4, 1988, there is described forming high density primary wiring patterns on PCBs with less than 0.005 inch spacings and wiring conductor widths, which claim to permit wider conductors of at least three times the wiring spacing and which are thus less likely to have open circuit or substrate adherence defects. This is achieved by depositing on an irregular surface of a conventional "flat" panel insulator a thick liquid photopolymer layer of paste-like consistency, such as to a 0.006 inch thickness, flattening it with the image bearing side of a glass plate photo-transparency to produce high resolution wiring patterns comprising ridge tops defining insulating spacing between channel conductor areas there-between by means of un-collimated actinic radiation, forming thin conductive layers 0.0014 inch thick on the channel bottoms and sidewalls to produce wider conductors, and sanding off the flat ridge tops to assure that there are no short circuits between adjacent conductors.

In U.S. Pat. No. 4,702,792, issued Oct. 27, 1987, there is described a method of forming fine conductive lines, patterns, and connectors on a substrate, particularly those useful for electronic devices. The method comprises a series of steps in which a polymeric material is applied to the substrate, the polymeric material patterned to form openings through, spaces within, or combinations thereof in the polymeric material, a conductive material is applied to the patterned polymeric material, so that it at least fills the openings and spaces existing in the polymeric material, with excess conductive material removed from the exterior major surface of the polymeric material using chemical-mechanical polishing to expose at least the exterior major surface of the polymeric material. The structure remaining has a planar exterior surface, wherein the conductive material filling the openings and spaces in the patterned polymeric material becomes features such as fine lines, patterns, and connectors which are surrounded by the polymeric material. The polymeric material may be left in place as an insulator or removed, leaving the conductive features on the substrate.

The present invention provides a new and unique process for plating highly dense conductive elements (e.g., circuit lines) on a surface of a circuitized substrate in a manner which substantially overcomes many of the aforementioned disadvantages. As defined herein, it is especially able to do so when further plating precious metallurgy on the lines, such added metallurgy deemed important to provide enhanced connections. In one embodiment, the invention is able to also provide high density arrays of thru-holes within the circuit pattern, adding even more versatility to the invention.

OBJECTS AND SUMMARY OF THE INVENTION

It is, therefore, a primary object of the invention to enhance the art of circuitized substrate manufacture in which plating is used to form conductors for the substrates.

It is another object of the invention to provide a method of plating such conductors which can be carried out in a relatively expeditious manner using many conventional processes.

According to one aspect of the invention, there is provided a method of forming a circuit pattern on a substrate, the method comprising providing a dielectric substrate, forming a first conductive layer on the substrate, forming a second conductive layer over the first conductive layer, this second conductive layer having a roughness greater than that of the first conductive layer, applying photo-resist material over the second conductive layer, exposing and developing the photo-resist material to define an initial circuit pattern within selected portions of the second conductive layer, forming a third conductive layer on the selected portions of the second conductive layer, performing a first removal step to remove a large portion of the photo-resist, performing a second removal step to remove substantially the remainder of the photo-resist, and removing selected portions of the first conductive layer and of the second conductive layer not having the third conductive layer thereon to define a final circuit pattern comprised of the selected portions of the second conductive layer and the third conductive layer.

BEST MODE FOR CARRYING OUT THE INVENTION

Figure 1:
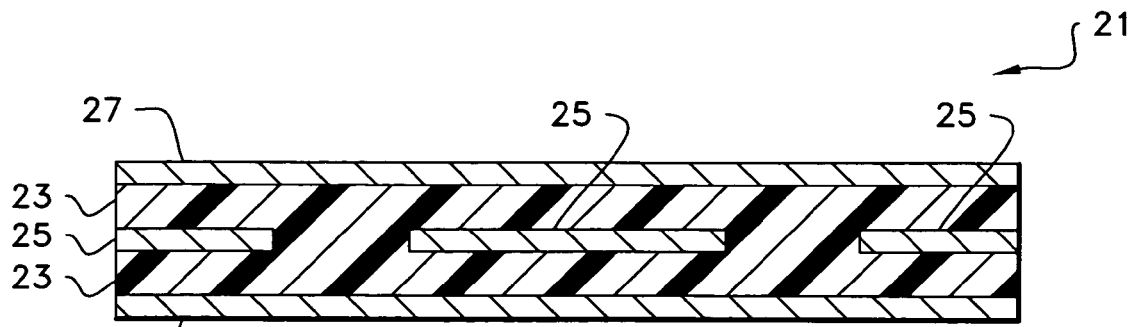
FIGS. 1–15 illustrate the various steps of pattern plating circuit patterns on a substrate, according to one embodiment of the invention.

For a better understanding of the present invention, together with other and further objects, advantages and capabilities thereof, reference is made to the following disclosure and appended claims in connection with the above-described drawings. Like numerals will be used from FIG. to FIG. to reference similar elements.

By the term "circuitized substrate" as used herein is meant to include substrates having at least one dielectric layer and at least one metallurgical conductive layer. Examples include structures made of dielectric materials such as fiberglass-reinforced epoxy resins (some referred to as "FR-4" dielectric materials in the art), polytetrafluoroethylene (Teflon), polyimides, polyamides, cyanate resins, polyphenylene ether resins, photoimageable materials, and other like materials wherein the conductive layers are each a metal layer (e.g., power, signal and/or ground) comprised of suitable metallurgical materials such as copper (preferably electrodeposited copper foil as defined herein-above), but in the broader aspects may also include additional metals (e.g., nickel, aluminum, etc.) or alloys thereof. Further examples will be described in greater detail herein-below. If the dielectric materials for the structure are of a photoimageable material, it is photoimaged or photopatterned, and developed to reveal the desired circuit pattern, including the desired opening(s) as defined herein, if required. The dielectric material may be curtain-coated or screen-applied, or it may be supplied as dry film. Final cure of the photoimageable material provides a toughened base of dielectric on which the desired electrical circuitry is formed. An example of a specific photoimageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photoimageable dielectric composition. The dielectric layers taught herein may be typically about 2 mils to about 4 mils thick, but also thicker if desired. Examples of circuitized substrates include printed circuit boards (or cards), hereinafter referred to also as PCBs, and chip carriers. It is believed that the teachings of the instant invention are also applicable to what are known as "flex" circuits (which use dielectric materials such as polyimide).

By the term "fluid treatment device" as used herein is meant a pressurized fluid spray apparatus/assembly adapted for precisely directing pressurized jets of fluid onto the surface of a material, typically as the material is passed there-through in the situation where such jets impinge from opposite sides of the material or, in its simplest form, where such apparatus/assembly utilizes such jets only on one side of the material and thus fluid is impinged on only said side. Apparatus/assemblies of this type are defined in U.S. Pat. No. 5,512,335 (Miller et al), U.S. Pat. No. 5,378,307 (Bard et al), U.S. Pat. No. 5,289,639 (Bard et al) and U.S. Pat. No. 5,063,951 (Bard et al), the teachings of these patents being incorporated herein by reference. In its simplest form, such as shown in U.S. Pat. No. 5,063,951 and U.S. Pat. No. 5,289,639, the device will include a plurality of such jets oriented in rows under or over which the material being treated will pass and receive pressurized fluid, e.g., etchants, water rinse, etc. thereon. Additional structure, such as vibration means may be utilized, as defined in U.S. Pat. No. 5,512,335, as well as an overflow sump arrangement with a plurality of such devices spacedly positioned there-along. An example of this latter apparatus/assembly is defined in U.S. Pat. No. 5,378,307.

As understood from the following, the present invention defines a new and unique method of providing circuitization on a substrate in which a resulting pattern of high resolution is possible. In order to accomplish this in a manner which overcomes many of the problems associated with the methods described in the foregoing patents, the invention utilizes a dual step approach for depositing the circuit's metallurgy (prior to any possible subsequent additional metallurgy such as defined herein) in combination with a dual step approach to removing the photo-resist which is used to define the circuit's pattern. The dual metallurgy approach assures a sufficiently "rough" external surface for the metallurgy to enhance photo-resist material adherence to in turn assure the high definition etching needed for the fine circuitry, in combination with the dual removal approach designed to substantially entirely remove any photo-resist following circuit definition.

Figure 2:
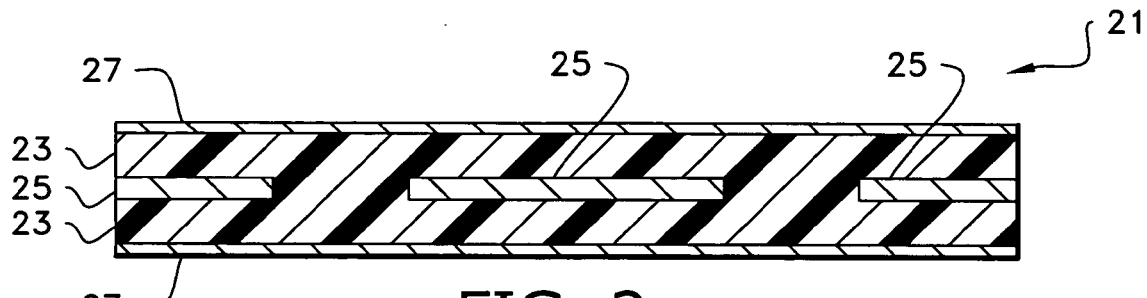

To achieve the above, the method starts with the provision of a suitable dielectric substrate, preferably of one of the above dielectric materials, and more preferably of the defined epoxy resin "FR4" material. In one example, a substrate having a thickness of 100 mils is provided. (A mil is 0.001 inch.) In a preferred embodiment, as shown in FIG. 1, a substrate 21 is shown which includes at least one dielectric layer 23. In a most preferred embodiment, substrate 21 includes at least two dielectric layers 23 with an interim conductive layer 25 (preferably copper) therein. Although three sections are shown for layer 25, it is understood this is one continuous layer and that the open portions therein are preferably holes, such as "clearance" holes if layer 25 is to serve as a power or ground layer in the final product. Alternatively, interim layer 25 may be a signal layer which will be eventually electrically coupled to other conductive parts of the final structure. A copper "foil" (layer) 27 having an initial thickness of 0.7 mils is bonded to the substrate, preferably using a known PCB lamination process. In a preferred embodiment, the copper foil 27 is laminated on opposite sides of substrate 21, as shown. These layers 27 are then "thinned" to a thickness of about 0.20 mils, using a chemical polishing method described in the aforementioned U.S. Pat. No. 6,547,974. The result is the structure shown in FIG. 2. In such a method, fluid treatment devices of the type described above and manufactured by the Assignee of the invention are used, for enhanced fluid application and metal removal. The purpose of the thinning of the copper layer is to reduce the overall copper thickness for subtractive processing, described below, thereby reducing etch "overhang" and "under-cut" of the copper.

Figure 3:
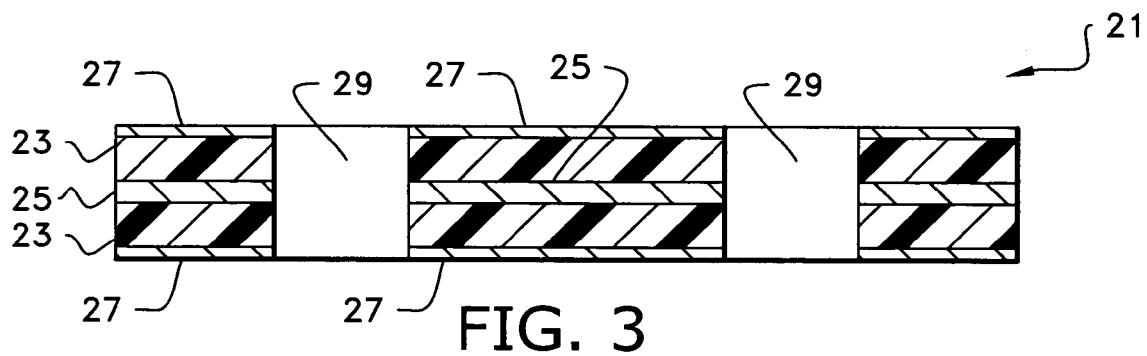

If the resulting circuitized substrate produced using the teachings herein is intended to include thru-holes of one or more of the types (e.g., entirely through the substrate or to a "blind" depth within the substrate from one surface) defined above as part thereof (a preferred embodiment of this invention), such holes (openings), represented by the numerals 29 in FIG. 3, are now formed within the now multi-layered composite, preferably using either a mechanical drilling procedure or a laser (most preferred). In one example, each of the openings or holes 29 is provided within the substrate with a diameter within the range of from about 2.0 mils (if using a laser) to about 250 mils (if using mechanical drills). In one example, a total of about 10,000 holes may be provided per square inch of the substrate, although other numbers are readily possible. This extremely close patterning of thru-holes represents one example of the high circuit densities attainable using the teachings of the instant invention.

Figure 4:
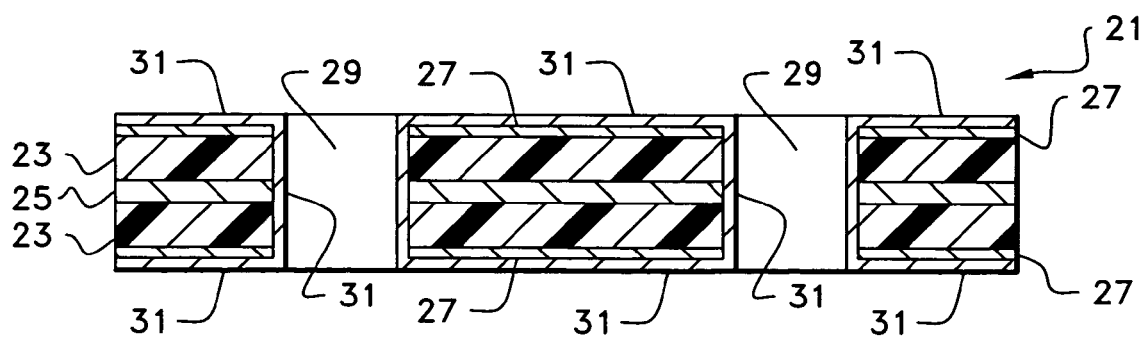
Figure 5:
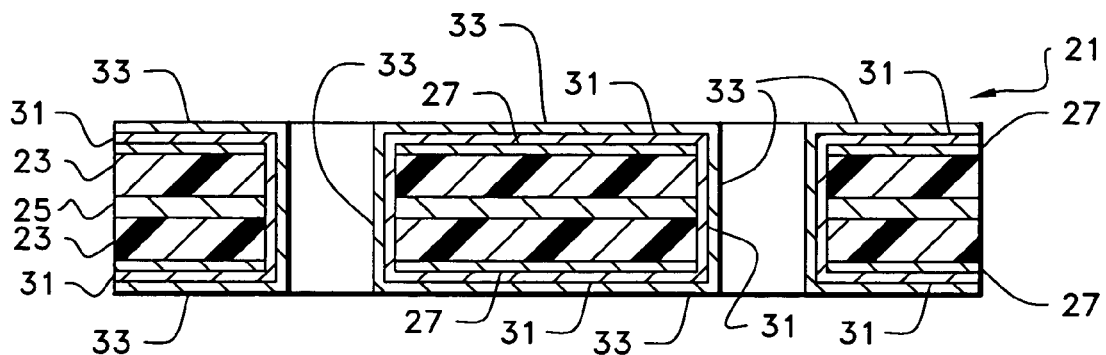

The next step of the invention involves providing a "rough strike" of metal over the remaining copper layer 27 on the supporting substrate, and within the formed holes 29. (Note that the metal of layer 27 does not extend within holes 29.) A preferred means of achieving this is to use electrolytic plating, in which electro-less plating is used to form a base or "seed" layer 31, this layer shown in FIG. 4. Then, a second, thin copper strike layer 33 (FIG. 5) is applied, preferably using electrolytic plating. The "seed" layer in one embodiment has a thickness of as thin as 0.5 microns up to two microns while the subsequently applied strike layer 33 has a thickness of about 0.2 mils. This double layer application represents a significant aspect of the invention for the reasons stated above (especially improved adhesion). A preferred method of achieving this is periodic reverse pulse acid copper plating at amperages within the range of about ten to twenty-five amperes per square foot. Forward to reverse current density ratios of up to about 1:3 may be utilized. Seed layer 31, with strike layer 33 thereon, thus covers all of the exposed surfaces of substrate 21, including those of the internal holes 29. Significantly, added "rough strike" layer 33 includes a surface roughness greater than that of the first conductive layer 27.

Figure 6:
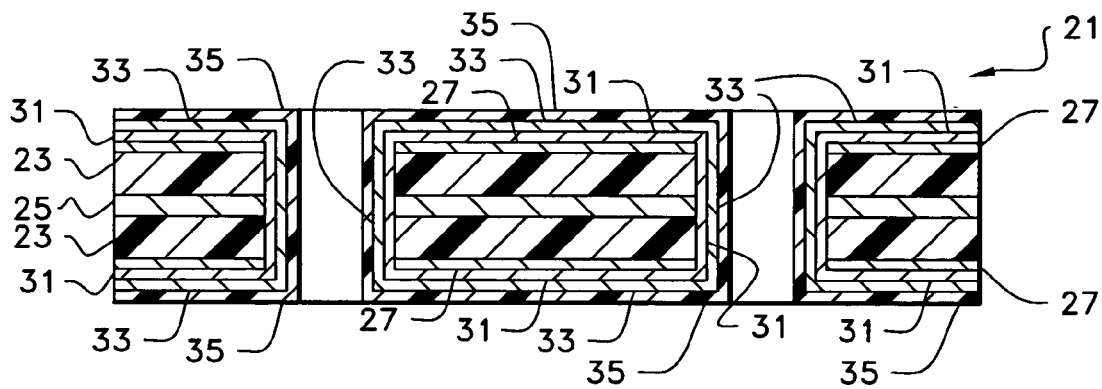

The exposed metallurgy on the substrate is now preferably subjected to a chemical treatment process. One preferred process involves exposing the copper metallurgy to what is referred to as a "BondFilm" solution currently available on the marketplace under this name from Atotech Deutschland GmbH, an international company having a U.S.A. business address at 1750 Overview Drive, Rock Hill, S.C. BondFilm solution is comprised primarily of three components: (1) sulfuric acid; (2) hydrogen peroxide; and (3) copper, as well as additional Atotech Deutschland GmbH proprietary constituents. This process is also referred to as an oxide alternative process, meaning that it does not result in the formation of oxide layers on the treated material. By way of example, the RMS roughness values for the exposed copper may now be raised slightly to from about 0.15 microns to about 0.6 microns with a peak of about 1.2 to about 2.2 microns. The BondFilm process involves exposing the copper to this solution for a period of from about fifteen to about twenty seconds at a solution temperature of about 20 to 35 degrees C. (C.). As part of this treatment, the copper's external surfaces are cleaned and degreased, following which a micro-etch of the surfaces occurs. Finally, a thin organic coating is applied to these surfaces. Such a thin coating, referenced by the numeral 35 in FIG. 6, is also referred to as a "conversion" coating. In one example, thin organic coating 35 is benzotriazole and possesses a thickness of from about 50 Angstroms to about 500 Angstroms. This process, although optional, is desired to further promote subsequent photo-resist adhesion.

Figure 7:
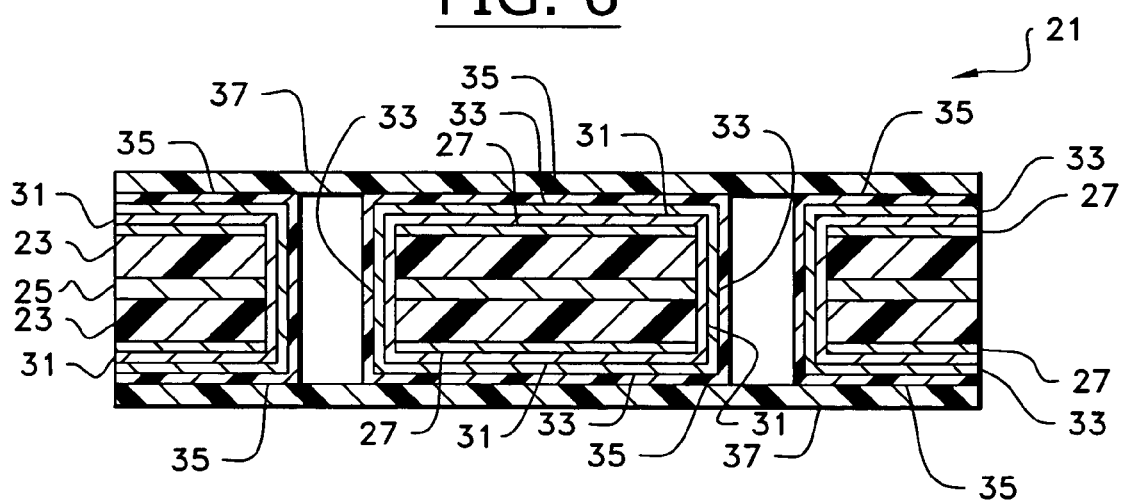

The next step of the invention involves the application of a suitable photo-resist material 37 (FIG. 7). In a preferred embodiment, a dry film photo-resist film from Morton Thiokol and sold under Morton's "5000 Series" of photo-resists is used. Alternatively, a liquid photo-resist material is possible. Thickness of the applied material depends in part on the desired line width and line spacings for the resulting circuit pattern. For example, if line width and line spacings of four mils each are required, a three mil thick photo-resist is possible, while if lines of widths and spacings of three mils are required, a thinner photo-resist having a thickness of only about two mils is possible. These examples represent the high density line patterns attainable using the teachings of this invention. Even greater densities are possible. As shown in FIG. 7, the photo-resist layer 37 covers all of the metallurgy (both the underlying copper and the covering (plated) copper thereover) on the upper and lower surfaces of substrate 21, but does not extend within holes 29, because of its thin film characteristics. As such a film, layers 37 "tent" these holes. Significantly, the adhesion of the photo-resist to the exposed upper and lower metallurgy is enhanced as a result of the aforementioned roughing steps.

Figure 8:
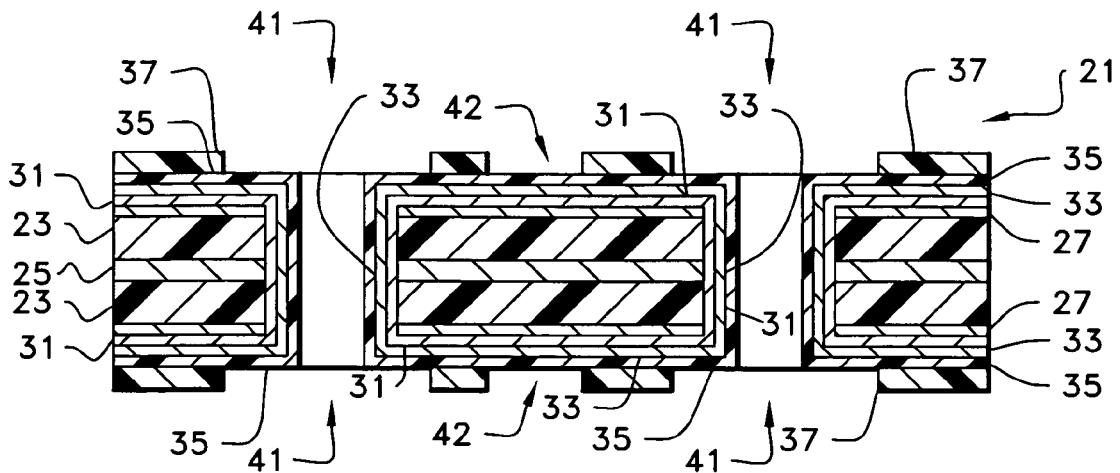

To produce the desired circuit pattern in the desired top and bottom metallurgy, a conventional photolithographic process used in PCB manufacturing is employed in which a mask is aligned over the photo-resist to define the underlying circuit pattern and exposure to actinic radiation occurs for a predetermined period. This processing could involve use of direct laser imaging, as well as conventional exposure using glass-film artwork. A vacuum is applied to assured mask adhesion to the photo-resist material during such processing. Further description of this known process is not considered necessary. As part of this processing, selected portions of the photo-resist 37 are removed, leaving open portions 41 and 42, as shown in FIG. 8, thereby exposing predetermined parts of the underlying metallurgy. In the embodiment shown in FIG. 8, the parts of the substrate 21 in the region of the two holes 29 are so exposed, at opposing ends thereof, in addition to a relatively small portion between both holes. This is not limiting of the invention because it is understood that other parts of the upper and lower metallurgy may be exposed, depending on the desired final circuitry configuration.

It has been discovered that subsequent exposure of the photo-resist to ultra-violet (UV) radiation for a shortened time period following the conventional developing (removal) step thereof serves to "toughen" (harden) the exposed material, a desirable feature for such a material about to undergo subsequent plating operations.

Figure 9:
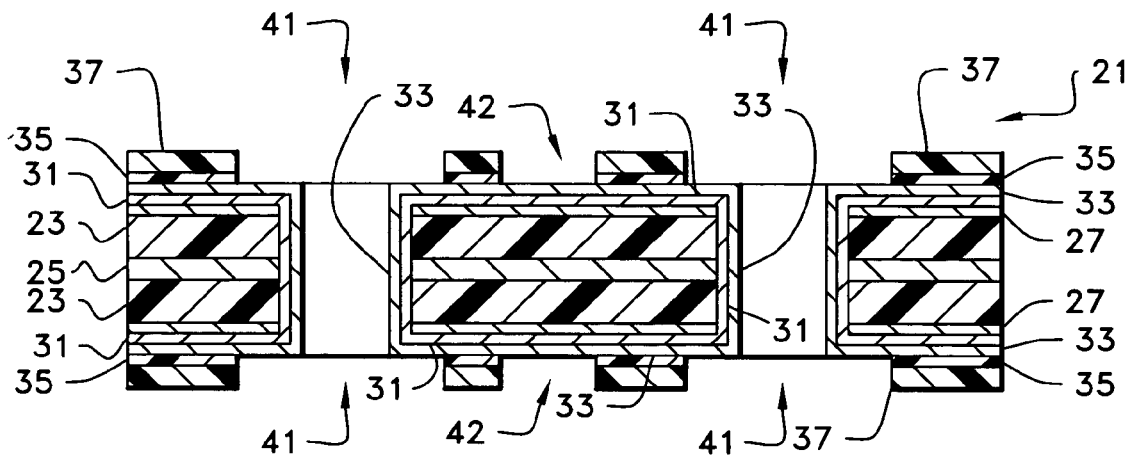

The next step may be referred to as a "microetch" step in which selected portions of organic coating 35 (and any photo-resist residues) are removed, including from within the holes 29, this being illustrated in FIG. 9. Removal within such holes is especially important to assure a sound connection to the interim conductive layer 25, if such a connection is desired. Other portions of coating 35 are also removed, including those on the exposed upper and lower surfaces of the metallurgy. Significantly, this "microetch" step is mild enough that it will not excessively consume the electro-less plated copper within the thru-holes or within any line channels. In one example, this etching occurred using a solution of sulfuric acid, copper sulfate and monopersulfate triple salt, at a temperature of about twenty-three degrees C. (C) for a dwell time of about 60 seconds.

Figure 10:
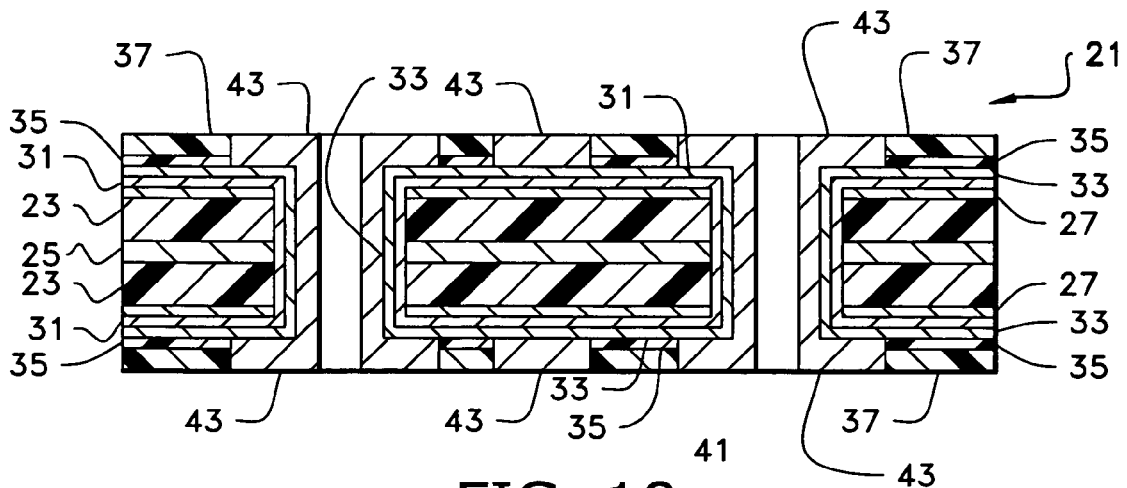

The next step, shown in FIG. 10, involves plating up of the metallurgy of the desired final circuit pattern for the substrate. This pattern results from the photolithographic processing defined above and, as understood, the exposed metallurgy is comprised of the thinned copper base layer 27 and the overlying "rough" copper strike layer 33. (Only the "strike" layer covers the internal walls of holes 29.) Electrolytic plating is preferred with appropriate current density and brightener considerations to apply a plated layer 43 covering such previously exposed metallurgy. Simultaneous plating of the lines, pads (if used) and thru-holes (if used) is accomplished to assure a relatively uniformly thick layer 43 of such plated material. In one example, the plating bath may be comprised of a brightener, a "leveler", copper sulfate, and sulfuric acid, and applied at a density of about 0.8 amperes per square meter. It is understood that other plating processes may be used at this phase of the invention and the invention is not limited to this particular process or the solution defined herein. It is also possible to use other solutions if electrolytic plating is desired. Layer 43, in a preferred embodiment, possesses a thickness within the range of from about one mil to about three mils.

Planarization of the resulting circuit pattern, having the above plating thereon, is next preferably accomplished. In a preferred embodiment, a combined chemical and mechanical polishing operation similar to that described in U.S. Pat. No. 6,547,974 is used. The purpose of this is to substantially planarize the circuit's top and bottom surfaces substantially flush to the non-conductive remaining photo-resist 37. This step is self-explanatory and thus not shown in the FIGS.

Figure 11:
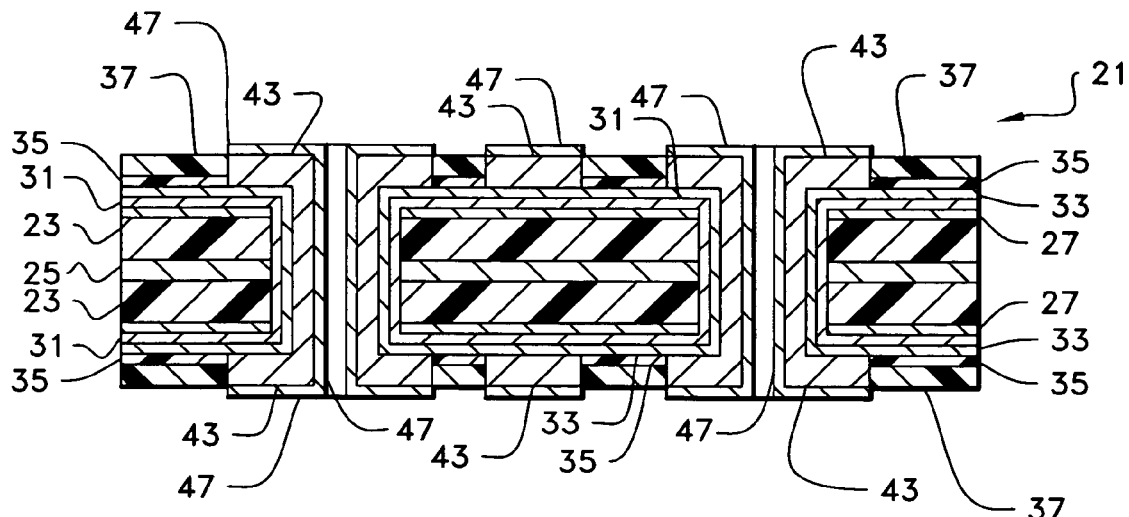

It is now desirable to form a layer of precious metallurgy (e.g., gold) atop the circuit metallurgy, for enhanced conductivity purposes. In a preferred embodiment, this is accomplished using an electrolytic plating operation in which a thin strike of a first non-precious metal (e.g., nickel) is deposited following which a thin strike of the precious metal (preferably gold) is deposited. For ease of reference, both such thin strikes are depicted as a single layer 47 in FIG. 11. It is also possible to deposit these metals with electro-less plating. In one example, a nickel layer having a thickness range of about 1.25 to about 8.0 microns is applied followed by a gold layer having a thickness of only about 0.05 to about 1.0 microns. For applications where a thicker gold is desired (e.g., where the circuitry is to engage connector leads or wirebonds, additional gold may be applied, including in both hard and subsequent soft form. In addition to providing enhanced conductivity, these layers serve as an etch mask during the etch process defined below. That is, these layers prevent etchant from attacking any underlying materials over which the layers are applied. In addition to nickel, other base metals such as cobalt may be used, while a metal other than gold, e.g., palladium, may be used. It is noted in FIG. 11 that layer 47 also covers the interior walls of the now-conductive holes 29.

Figure 12:
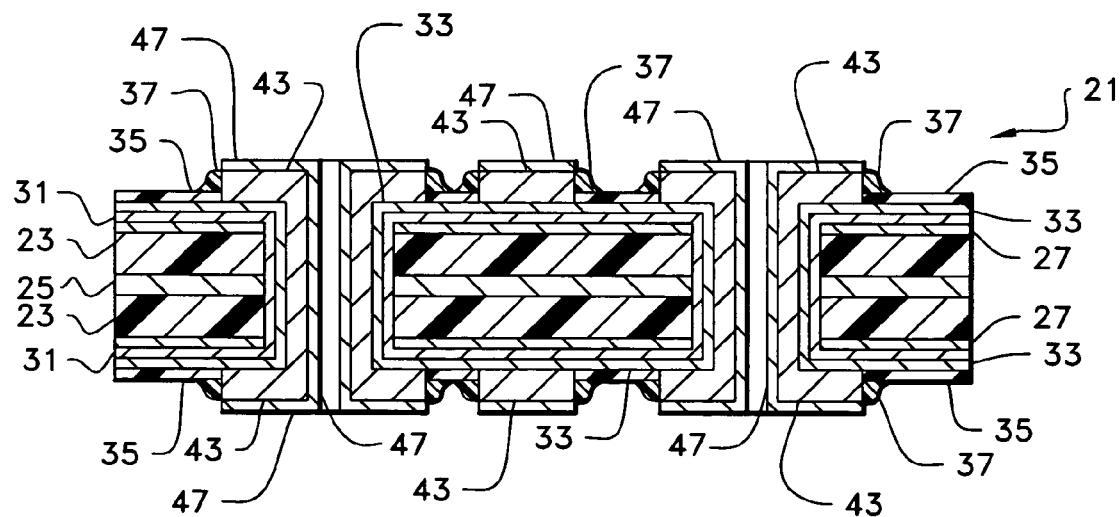
Figure 13:
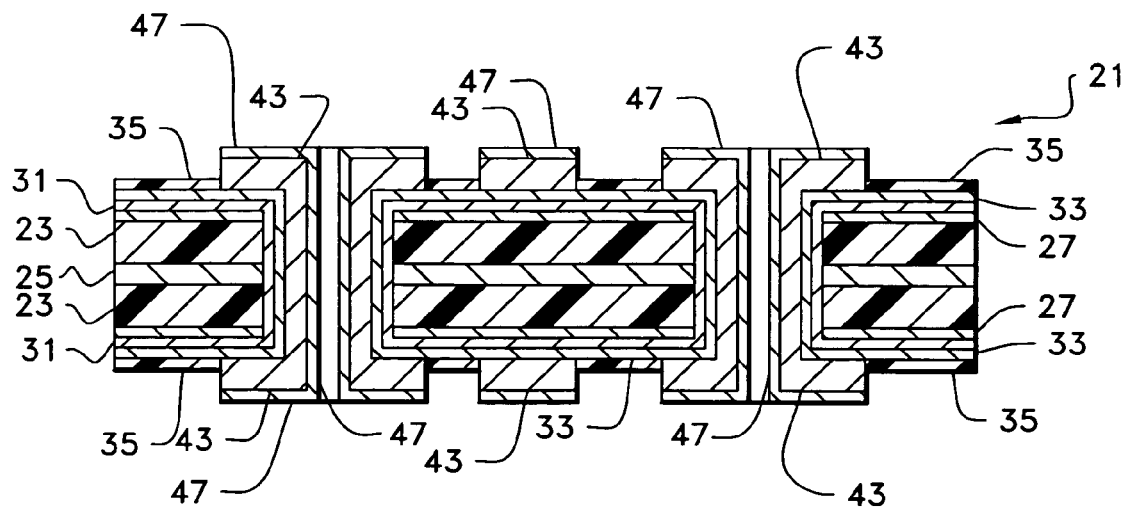

The next phase of the invention involves the two-step removal of the photo-resist material (noting that some portions thereof had been removed above). This represents a significant phase of the invention because it assures that all of the remaining photo-resist is removed, despite its strong adherence to the metallurgy as a result of the roughening thereof described above and, significantly, some mechanical "pinning" of the photo-resist by the closely spaced, plated metallurgy. Removal, as stated, is accomplished in two steps. In the first, an ozone friendly photo-resist stripper (e.g., benzyl alcohol) is used to remove about ninety-nine percent of the photo-resist material, such removal depicted in FIG. 12. Following this step, a second stripper is applied to remove any final remnants of material. In one example, a photo-resist stripping solution sold under the product name "MS1109" by Dexter Electronics (Materials Division) is used, this solution comprised of a strong sodium hydroxide component in combination with tetrahydrofuryl alcohol. In a preferred embodiment, the second removal is accomplished by placing the parts (substrates) in a suitable carrier which is then dipped into the "MS1109" solution for approximately five minutes at a temperature of about 175 degrees F. Two cascading water (de-ionized water) rinses are next performed followed by application of a high pressure (e.g., 1500 to 1800 p.s.i.) rinse. This unique process has effectively removed any remaining remnants of photo-resist material, as now seen in FIG. 13. Understandably, any remaining such material, even so slight, can have a serious adverse impact on the resulting substrate product, including possible electrical shorting of adjacent circuit lines. The method as taught herein substantially eliminates any such possibility.

Figure 14:
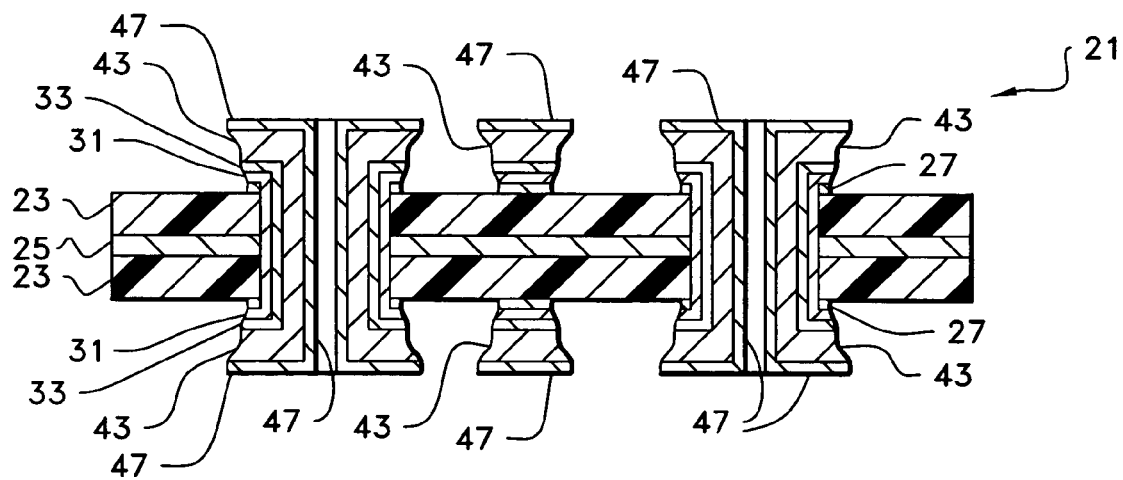

Etching of the remaining thin copper, rough strike metallurgy 33 is now accomplished, preferably using a slow etch rate, multiple pass operation. In one example, the metallurgy is sprayed with etchant at a pressure of about 20–22 p.s.i. during a first pass on a conveyor at a speed within the range of about 35 inches per minute to about 50 inches per minute, depending on the desired final thickness for the circuit pattern. Subsequent passes at higher speeds (e.g., 80 inches per minute) may be performed, with microscopic inspection occurring following each pass. Such inspection assures the precise undercut desired (and necessary) to assure the high definition required. This is shown in FIG. 14.

Figure 15:
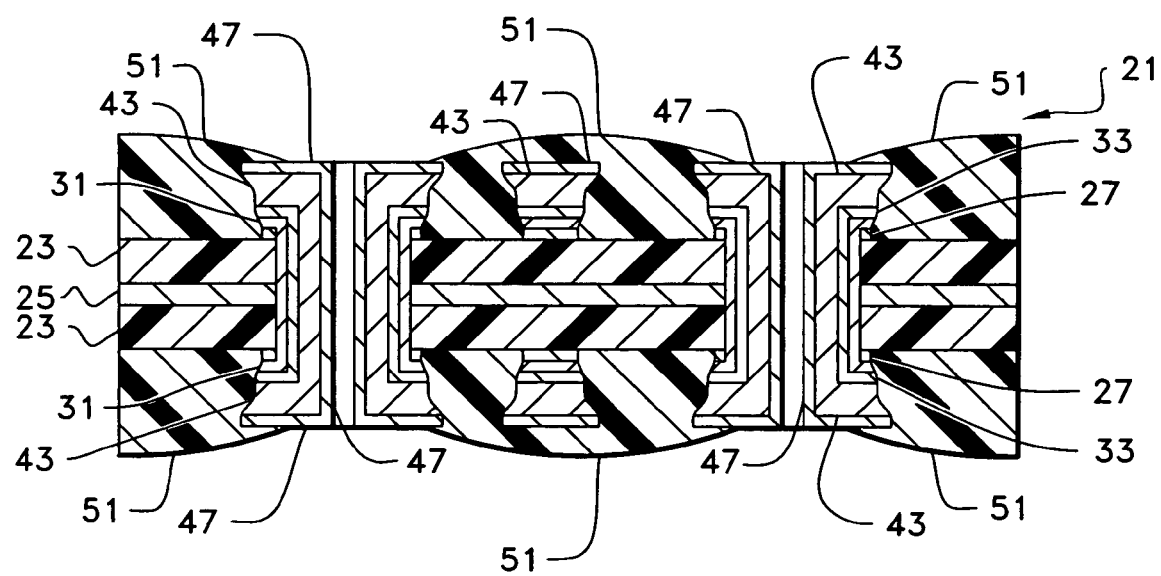

The resulting substrate, having the circuit pattern formed thereon, is now adapted for functioning as a circuitized substrate (e.g., PCB or chip carrier) or may form part of a larger structure having more similar substrates as part thereof. If the latter, the substrate may be aligned with other such substrates and laminated to form the final structure. If thru-holes are used, such thru-holes may be aligned with thru-holes in other such structures and coupled electrically, e.g., using conductive paste. Dielectric layers (e.g., pre-preg sheets) may also be utilized between respective substrates, as is known in the PCB manufacturing art. Exterior portions of the resulting substrate may also have liquid photoimageable or selectively screened soldermask material 51 applied thereto, as shown in FIG. 15. Such soldermask materials are known in the art as defining pre-selected portions of the substrate's conductive metallurgy designated to receive solder (not shown). In FIG. 15, this solder may be in the form of solder balls and may be applied directly onto the upper and lower exposed surfaces of the formed thru-holes.

Thus there has been shown and described a method of providing fine line circuitry on a substrate in which the circuitry is initially at least of two layers of metallurgy and in which photolithographic processing is used, including the use of photo-resist material. Removal of the photo-resist is accomplished using a two-step approach in which a large percentage of the photo-resist is initially removed following which a remainder is removed.

While there have been shown and described what at present are considered the preferred embodiments of the invention, it will be obvious to those skilled in the art that various changes and modifications may be made therein without departing from the scope of the invention as defined by the appended claims.

What is claimed is:

1. A method of forming a circuit pattern on a substrate, said method comprising:

providing a dielectric substrate;

forming a first conductive layer on said substrate;

forming a plurality of holes within said dielectric substrate;

forming a second conductive layer over said first conductive layer and onto the surfaces of said plurality of said holes within said dielectric substrate;

forming a third conductive layer over said second conductive layer, said third conductive layer having a roughness greater than said first conductive layer;

applying photo-resist material over said third conductive layer;

exposing, developing and removing portions of said photo-resist material to define an initial circuit pattern within selected portions of said third conductive layer;

forming a fourth conductive layer on said selected portions of said third conductive layer;

performing a first removal step to remove a large portion of the remainder of said photo-resist material;

performing a second removal step to remove substantially the remainder of said photo-resist material; and removing parts of said first, second and third conductive layers to define a final circuit pattern comprised of selected portions of said first, second, third and fourth conductive layers.

2. The method of claim 1 wherein said forming of said first conductive layer is accomplished by lamination.

3. The method of claim 2 further including thinning said first conductive layer prior to forming said second conductive layer over said first conductive layer.

4. The method of claim 1 wherein said forming of said first conductive layer on said substrate is accomplished using an electro-less plating operation.

5. The method of claim 1 wherein said forming of said second conductive layer on said first conductive layer and said forming of said third conductive layer on said second conductive layer are each accomplished using an electrolytic plating operation.

6. The method of claim 1 further including treating said third conductive layer with an adhesion promoting composition prior to applying said photo-resist material.

7. The method of claim 1 wherein said photo-resist material is applied in dry film form.

8. The method of claim 7 further including exposing said photo-resist in said dry film form to ultraviolet radiation following said exposing and developing of said photo-resist material.

9. The method of claim 1 wherein said performing of said first removal step to remove a large portion of said photo-resist material is accomplished with a first photo-resist removal composition and said performing of said second removal step to remove substantially the remainder of said photo-resist material is accomplished with a second photo-resist removal composition.

10. The method of claim 9 wherein said second photo-resist removal composition is different than said first photo-resist removal composition and is of greater strength than said first photo-resist removal composition.

11. The method of claim 1 further including adding a quantity of soldermask material on said substrate to substantially cover portions of said substrate and to define selected exposed regions of said third conductive layer.

12. The method of claim 1 further including providing a thin organic coating on said second conductive layer prior to said applying of said photo-resist material over said second conductive layer.

13. The method of claim 1 wherein said performing of said first removal step to remove a large portion of said photo-resist material removes about 99 percent of said photo-resist material and said performing of said second removal step removes substantially the remainder of said photo-resist material.

14. The method of claim 1 wherein said applying of said photo-resist material over said third conductive layer does not result in said photo-resist material being applied over the portion of said third conductive layer within said plurality of said holes.

15. The method of claim 14 wherein said photo-resist material covers said holes.

* * * * *